(12) United States Patent
Kronholz et al.

(10) Patent No.: US 8,836,047 B2
(45) Date of Patent: Sep. 16, 2014

(54) REDUCING DEFECT RATE DURING DEPOSITION OF A CHANNEL SEMICONDUCTOR ALLOY INTO AN IN SITU RECESSED ACTIVE REGION

(75) Inventors: Stephan-Detlef Kronholz, Dresden (DE); Peter Javorka, Radeburg (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 217 days.

(21) Appl. No.: 13/421,394

(22) Filed: Mar. 15, 2012

(65) Prior Publication Data

US 2012/0235249 A1 Sep. 20, 2012

(30) Foreign Application Priority Data

Mar. 16, 2011 (DE) .................. 10 2011 005 639

(51) Int. Cl.
| | | |
|---|---|---|
| H01L 27/04 | (2006.01) | |
| H01L 21/8238 | (2006.01) | |
| H01L 21/84 | (2006.01) | |
| H01L 21/8234 | (2006.01) | |
| H01L 21/762 | (2006.01) | |
| H01L 27/12 | (2006.01) | |

(52) U.S. Cl.
CPC ........ *H01L 21/84* (2013.01); *H01L 21/823807* (2013.01); *H01L 21/823481* (2013.01); *H01L 21/823412* (2013.01); *H01L 21/76283* (2013.01); *H01L 21/823878* (2013.01); *H01L 27/1203* (2013.01)
USPC ............................ 257/402; 257/506; 438/221

(58) Field of Classification Search
CPC . H01L 21/02532; H01L 21/20; H01L 27/092; H01L 27/0922

USPC .................. 257/369, 402; 438/222, 285, 296
See application file for complete search history.

(56) References Cited

U.S. PATENT DOCUMENTS

| | | | |
|---|---|---|---|
| 6,464,843 B1 | 10/2002 | Wicker et al. | 204/192.15 |
| 7,262,451 B2 * | 8/2007 | Mandelman et al. | 257/301 |
| 2002/0086118 A1 * | 7/2002 | Chang et al. | 427/447 |
| 2008/0079086 A1 * | 4/2008 | Jung et al. | 257/369 |
| 2010/0193881 A1 | 8/2010 | Kronholz et al. | 257/402 |
| 2010/0289094 A1 * | 11/2010 | Reichel et al. | 257/409 |

FOREIGN PATENT DOCUMENTS

DE 102009006886 A1 8/2010 .......... H01L 21/8234

OTHER PUBLICATIONS

Widmann et al., "Technologie hochintegrierter Schaltungen," 2nd edition, Berlin, Springer, pp. 63-67, 1996.
Ray et al., "Low-temperature deposition of silicon oxide films by microwave plasma CVD of TEOS," *Semicond. Sci. Technol.*, vol. 5, pp. 361-363, 1990.
Translation of Official Communication from German Patent Office for German Patent Application No. 10 2011 005 639.4 dated Nov. 17, 2011.

* cited by examiner

*Primary Examiner* — Daniel Shook
(74) *Attorney, Agent, or Firm* — Amerson Law Firm, PLLC

(57) ABSTRACT

When forming sophisticated high-k metal gate electrode structures on the basis of a threshold voltage adjusting semiconductor alloy, a highly efficient in situ process technique may be applied in order to form a recess in dedicated active regions and refilling the recess with a semiconductor alloy. In order to reduce or avoid etch-related irregularities during the recessing of the active regions, the degree of aluminum contamination during the previous processing, in particular during the formation of the trench isolation regions, may be controlled.

2 Claims, 5 Drawing Sheets

REDUCING DEFECT RATE DURING DEPOSITION OF A CHANNEL SEMICONDUCTOR ALLOY INTO AN IN SITU RECESSED ACTIVE REGION

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith, the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although generally usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance, even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and thus the threshold voltages in a very advanced process stage.

Basically, the concept of forming sophisticated gate electrode structures in an early manufacturing stage on the basis of a threshold voltage adjusting semiconductor alloy is a very promising process sequence since very complex process steps for replacing conventional gate materials in a very advanced manufacturing stage, as is typically associated with so-called replacement gate approaches, may require significant modifications of the overall process flow at a final phase of providing the semiconductor-based circuit elements. Consequently, many process strategies have been proposed in which a silicon/germanium alloy may be selectively formed as a part of one type of active region, while other active regions, such as active regions for N-channel transistors or any other transistors, which do not require the incorporation of a threshold voltage adjusting material, may be appropriately masked. To this end, any appropriate hard mask material may be provided and patterned so as to expose the active regions under consideration, which are then exposed to a deposition atmosphere in order to form the desired threshold voltage adjusting semiconductor material on the basis of selective epitaxial growth techniques. During this deposition process, the material composition and the layer thickness have to be precisely controlled in order to reduce the overall variability of transistor characteristics, such as the threshold voltage. For example, in a silicon/germanium alloy, a germanium concentration of up to 25 atomic percent and a layer thickness of approximately 8-50 nm may be selected in order to obtain the required threshold voltages of sophisticated P-channel transistors having a gate length of 50 nm and less. It turns out, however, that even minute variations of any of these parameters may strongly influence the finally obtained transistor characteristics, wherein, in particular, a significant variance of the threshold voltage may be observed with respect to a difference in transistor width or otherwise the same transistor devices. Since it is believed that, in particular, any edge effects upon selectively growing the semiconductor alloy in the active region may have a pronounced influence on the finally obtained material characteristics, it has been proposed to provide superior deposition characteristics by recessing the active region prior to actually growing the semiconductor alloy. In this manner, highly uniform growth conditions may be obtained across the entire active region since the dielectric material of the isolation regions that laterally delineate the active region suppress any lateral growth and thus also provide well-defined growth conditions at the edges of the active regions. To this end, highly efficient etch strategies have been developed in which, in some very promising approaches, the corresponding etch process is performed in situ with the actual selective growth process, i.e., an appropriate etch atmosphere is established within the deposition reactor, wherein the material of the active region is removed in a highly selective manner with respect to the trench isolation region. For example, an etch atmosphere on the basis of hydrochloric acid (HCl) may be readily established in the deposition chamber by using similar precursor gases, for instance except for a reducing gas component, so that a very efficient etch process may be established in order to form a recess having a desired depth, thereby achieving the superior deposition conditions. At the same time, the recessing may be controlled in order to achieve a highly planar surface topography with respect to other active regions, which are masked during the selective deposition process. In this manner, the subsequent patterning process for forming the sophisticated gate electrode structures may be performed on similar height levels for any active region.

Although the above-described process sequence is basically a very efficient mechanism for implementing the threshold voltage adjusting semiconductor alloy, it turns out that significant device failures may be observed, as will be described in more detail with reference to FIGS. 1a and 1b.

FIG. 1a schematically illustrates a cross-sectional view of a semiconductor device 100 in an early manufacturing stage. As shown, the device 100 comprises a substrate 101 such as a silicon substrate or any other appropriate carrier material which has formed thereon a semiconductor layer 102, typically a silicon-based semiconductor material. Furthermore, in some cases, a silicon-on-insulator (SOI) configuration is provided for the device 100, in which case a buried insulating material (not shown) is formed directly below the semiconductor layer 102. In other cases, a bulk configuration is formed by the layer 102 and the substrate 101, in which case the semiconductor material 102 is initially a portion of or directly connects to a crystalline semiconductor material of the substrate 101. Furthermore, in the manufacturing stage shown, a plurality of active regions, which are to be understood as semiconductor regions in and above which one or more transistor elements are to be formed, laterally delineated by a trench isolation structure 102C. For convenience, active regions 102A, 102B are illustrated, wherein the active regions 102A receive a semiconductor alloy 103A, while the active region 102B is masked by an appropriate hard mask material 104.

The semiconductor device 100 is formed on the basis of the following process techniques. The trench isolation region 102C is typically formed by applying sophisticated lithography techniques in which appropriate hard mask materials are patterned so as to define the position, lateral size and shape of active regions 102A, 102B. Thereafter, sophisticated etch techniques are applied in order to form trenches in the semiconductor layer 102, which are subsequently filled with a dielectric material such as silicon dioxide. To this end, high density plasma deposition techniques have proven to be viable process techniques for reliably filling the trenches without creating any voids. Frequently, the high density plasma deposition process is actually a sequence of deposition and etch processes wherein a previously formed sub-layer may be re-etched, for instance on the basis of a nitrogen fluoride-containing reactive process atmosphere, in order to preferably remove material on the edges of the corresponding trenches. Thereafter, a further deposition process may be applied, followed by another etch process, thereby increasingly filling the trenches from bottom to top substantially without creating any voids in the trench isolation region 102C. Thereafter, anneal processes may be applied and excess material may be removed by planarization techniques. Prior to or after forming the trench isolation region 102C, a basic dopant profile may be established in the active regions 102A, 102B in accordance with the overall transistor requirements. To this end, well-established implantation techniques and masking regimes are available. Thereafter, a hard mask material such as silicon dioxide, silicon nitride and the like may be formed, for instance, by oxidation, deposition and the like, and the resulting layer is patterned by using lithography techniques in order to mask any active regions that do not require a threshold voltage adaptation on the basis of an additional semiconductor material. For example, the active region 102B is illustrated as a corresponding region which may, for instance, receive an N-channel transistor during the further processing. Thereafter, any cleaning processes may be applied, for instance, on the basis of hydrofluoric acid (HF) so as to remove contaminants, native oxides and the like. Next, the device 100 is brought into a process environment 130, for instance in the form of a deposition process chamber in which initially a reactive etch atmosphere is established, as indicated by 131, in order to recess any exposed active regions, such as the regions 102A, which may be accomplished on the basis of hydrochloric acid (HCl), as discussed above. In this manner, recesses 102R may be formed in a highly controllable manner without unduly contaminating any exposed surface areas of the device 100. As discussed above, the degree of recessing 102R may be adjusted so as to obtain, after the deposition of the semiconductor alloy 103A on the basis of a selective deposition process 132, a desired overall surface topography. It is well known that a selective epitaxial growth process may be performed on the basis of appropriate precursor materials and process parameters so as to initiate the growth of semiconductor material 103A on exposed crystalline surface areas, such as (100) crystal planes of the active regions 102A, while a pronounced material deposition on any dielectric surface areas is significantly suppressed. Consequently, the recesses 102R may provide substantially uniform growth conditions across the entire active regions 102A and also at the edges of the trench isolation region 102C.

FIG. 1b schematically illustrates the device 100 after completing the above-described process sequence within the process environment 130 (FIG. 1a), wherein frequently very pronounced irregularities may be observed. For example, in one of the active regions 102A, a significant portion of the base material may have been removed during the preceding process sequence and thus material 103A may be formed only in a non-controllable manner or a corresponding active region 102A may comprise substantially no semiconductor material at all. Irrespective of the amount of any remaining semiconductor material, as indicated by 102D, the further processing for the respective active region 102A may, therefore, result in a severe device failure, such as a missing transistor of a memory cell and the like.

Thus, although basically a very efficient overall process flow may be provided on the basis of the sequence as described above in which, in principle, highly uniform deposition conditions may be provided, the application of the above-described process sequence in a production environment is less than desirable due to the above-described significant irregularities after formation of the threshold voltage adjusting semiconductor alloy 103A.

In view of the situation described above, the present disclosure relates to manufacturing techniques and semiconductor devices in which a semiconductor alloy may be formed selectively on active regions on the basis of a recessed surface configuration formed on the basis of an in situ process, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which a semiconductor alloy, such as a silicon/germanium alloy and the like, may be formed on specific active regions so as to be a part thereof, for instance in order to adjust the overall electronic characteristics by applying an in situ process in which a desired degree of recessing may be accomplished in addition to forming the desired semiconductor alloy. On the other hand, the occurrence of any irregularities may be significantly reduced by reducing the degree of aluminum contamination at and prior to processing the semiconductor device in a process environment used for forming the semiconductor alloy. Without intending to restrict the present application to the following explanation, it is nevertheless assumed that the presence of aluminum species, in particular during the process of recessing the active regions, may result in a very high etch rate since the aluminum species may act as a "catalyst" material during the etch process, thereby removing a significant portion of the initial base material of the active region under consideration. Based on this recognition, the present disclosure provides manufacturing techniques and semiconductor devices in which the probability of aluminum contamination of the semiconductor device may be significantly reduced. In some illustrative aspects disclosed herein, in particular the process for forming the trench isolation region, may be performed on the basis of a process environment in which the probability of creating aluminum contaminants may be significantly reduced.

One illustrative method disclosed herein comprises forming a trench isolation structure in a semiconductor layer of a semiconductor device in a deposition process environment by reducing a potential of aluminum contamination of the semiconductor layer in the deposition process environment. The trench isolation structure laterally delineates an active region in the semiconductor layer. The method further comprises removing material of the active region selectively to the trench isolation structure so as to form a recess. The method further comprises forming a layer of a semiconductor alloy in the recess and forming a gate electrode structure of a transistor on the layer of a semiconductor alloy.

A further illustrative method disclosed herein comprises establishing a first process atmosphere in a first process environment by controlling aluminum contamination of the first process atmosphere. The method further comprises forming a trench isolation region in a semiconductor layer of a semiconductor device in the first process atmosphere so as to laterally delineate an active region in the semiconductor layer. The method further comprises forming a recess in the active region by establishing an etch atmosphere in a second process environment. Additionally, the method comprises forming a threshold voltage adjusting semiconductor material in the recess by establishing a deposition atmosphere in the second process environment. The method further comprises forming a gate electrode structure of a transistor on the threshold voltage adjusting semiconductor material.

One illustrative semiconductor device disclosed herein comprises a trench isolation structure formed in a semiconductor layer and having a substantially uniform aluminum concentration profile along a depth. The semiconductor device further comprises an active region formed in the semiconductor layer and laterally delineated by the trench isolation structure so as to define a first length and a width of the active region. The semiconductor device further comprises a threshold voltage adjusting semiconductor alloy formed on the active region and extending along the width of the active region so as to substantially not overlap with the trench isolation structure. Moreover, the semiconductor device comprises a gate electrode structure formed on the threshold voltage adjusting semiconductor alloy wherein the gate electrode structure comprises a high-k dielectric material and a metal-containing electrode material formed above the high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
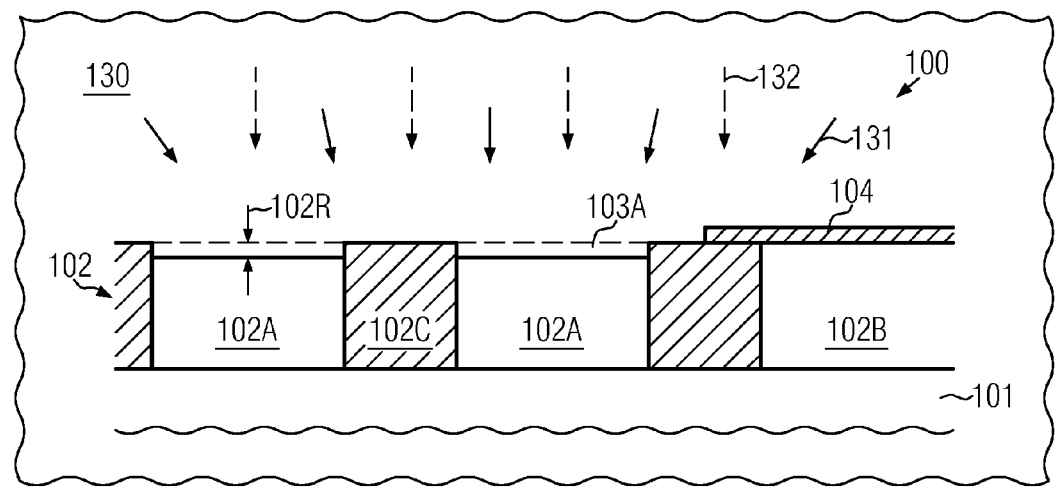
FIG. 1a schematically illustrates a cross-sectional view of a semiconductor device in a process environment in which a recess and a threshold voltage adjusting semiconductor alloy are formed in an in situ process, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which a semiconductor alloy, such as a silicon/germanium alloy and the like, may be formed on specific active regions so as to represent a part thereof, for instance for adjusting the threshold voltage of sophisticated transistor elements. To this end, an efficient in situ process technique may be applied for recessing the active region prior to actually depositing the semiconductor alloy. In order to significantly reduce the device failures caused by a "missing" portion of the semiconductor material in the active regions, the aluminum contamination prior to and during the processing of the device may be controlled in a highly efficient manner so as to significantly reduce the overall aluminum contamination compared to conventional strategies in which a specific control of aluminum incorporation and contamination is not taken into consideration. Without intending to restrict the present application to the following explanation, it is believed that the presence of an aluminum species may have a significant affect on the finally obtained etch rate during the recessing of the active regions. That is, the reactive etch component, such as hydrochloric acid (HCl), may have a significantly increased etch rate in the presence of even minute aluminum amounts, which may thus result in significant etch-related irregularities, for instance substantially all of the semiconductor material in the active region may be removed, which may then not be reestablished during the deposition process due to its selective deposition behavior. According to the principles disclosed herein, it is strongly assumed that one important degradation mechanism of the in situ process may be seen in the presence of an aluminum species in a semiconductor device or portions thereof, or within a process atmosphere of a process environment used to perform the in situ process. In this respect, in particular the process of forming trench isolation regions has been identified as a potential contributor to a pronounced aluminum contamination, as will be explained with reference to FIG. 1c.

Figure 1B:
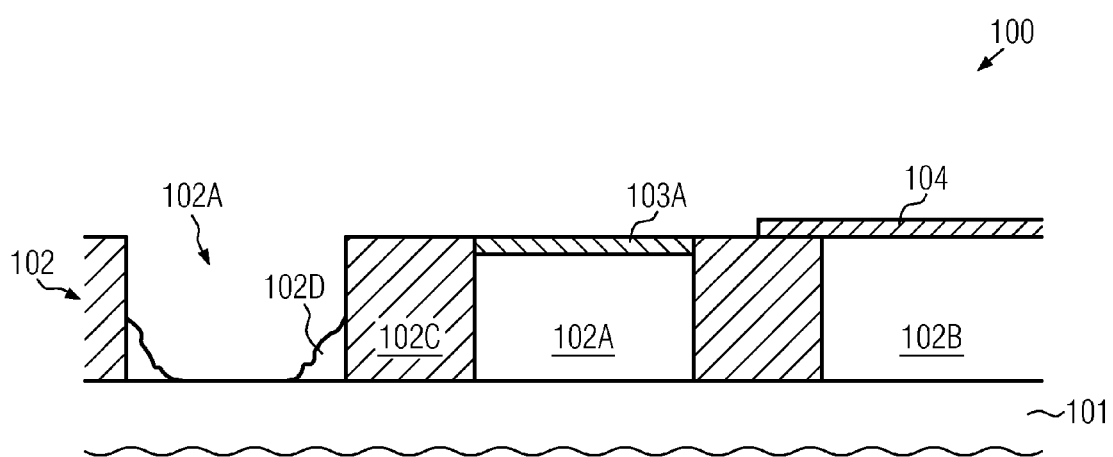
FIG. 1b schematically illustrates a cross-sectional view of the semiconductor device wherein significant device failures may be observed after the above-described process sequence due to a "missing" material in the active regions.
Figure 1C:
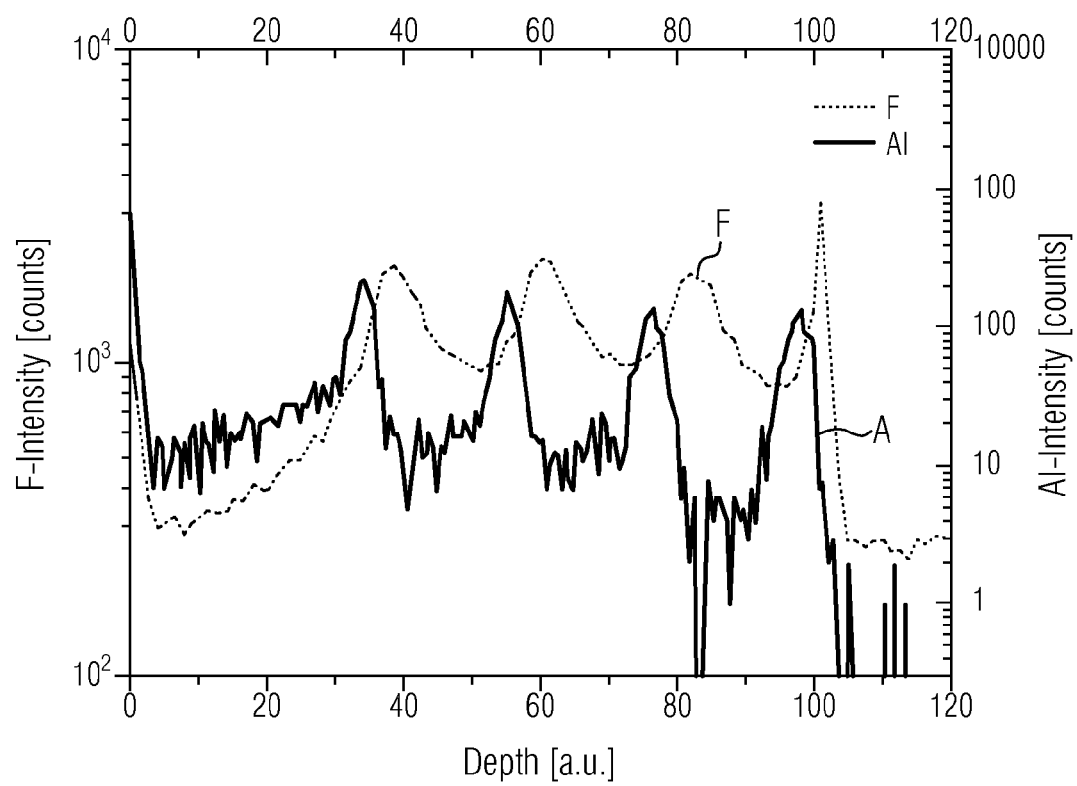
FIG. 1c schematically illustrates a graph indicating the incorporation of aluminum species and fluorine species in trench isolation regions when formed on the basis of a high density plasma deposition/etch strategy with non-controlled aluminum contamination, according to conventional process strategies.

FIG. 1c schematically illustrates a graph indicating the results of an analysis of a secondary ion mass spectrography (SIMS) in which the depth profile of aluminum and fluorine species have been determined. The horizontal axis represents the depth in arbitrary units, while the left hand vertical axis represents the fluorine intensity in the form of event counts, while on the other hand the vertical axis on the right hand side represents the aluminum intensity. Thus, curve A illustrates the aluminum intensity with varying depth, wherein it is clearly visible that at certain depth values a significant increase of the aluminum intensity is present. Similarly, somewhat shifted with respect to the aluminum peaks, the corresponding fluorine concentration values periodically increase, as indicated by curve F. Without restricting the present application to the following explanation, it is believed that in particular the deposition/etch sequence performed in sophisticated high density plasma deposition techniques may periodically result in a corresponding sputtering of aluminum species caused by the presence of aluminum hardware components in the deposition chamber, thereby also incorporating a corresponding increased aluminum concentration at the corresponding etch phase, which is typically performed in the presence of a fluoride species. Consequently, by applying any such sophisticated deposition/etch strategies, aluminum species may be created within the corresponding process atmosphere and also within the semiconductor device, which may contribute to an aluminum contamination during the further processing, which in turn may result in significant device failures, as discussed above.

Consequently, according to the principles disclosed herein, the aluminum contamination, i.e., the presence of aluminum species within any process atmospheres and/or within any device regions, such as trench isolation regions, may be controlled and thus reduced in order to enable the implementation of the highly efficient in situ process technique described above into volume production environments.

With reference to FIGS. 2a-2f, further illustrative embodiments will now be described in more detail, wherein reference may also be made to FIGS. 1a-1c, if appropriate.

Figure 2A:
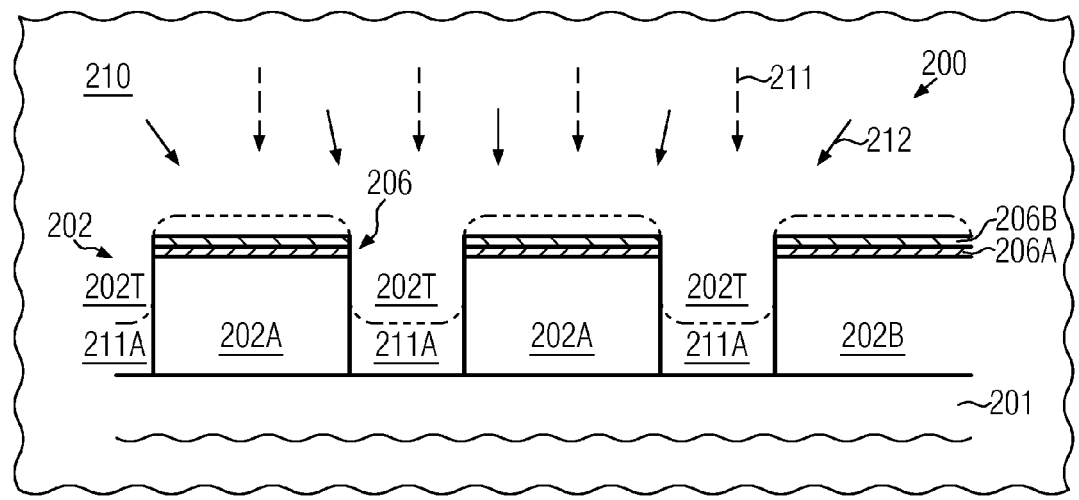
FIG. 2a schematically illustrates a cross-sectional view of a semiconductor device in a manufacturing process for forming trench isolation regions on the basis of a process environment in which aluminum contamination of a process atmosphere may be controlled so as to obtain a reduced aluminum contamination for the further processing of the device, according to illustrative embodiments.

FIG. 2a schematically illustrates a cross-sectional view of a semiconductor device 200 in a manufacturing stage in which trench isolation regions are to be formed in a process environment having a reduced aluminum contamination. The device 200 may comprise a substrate 201 in combination with a semiconductor layer 202, which may have similar characteristics as is also discussed above with reference to the semiconductor device 100. For example, the semiconductor layer 202 and the substrate 201 may represent an SOI configuration or a bulk configuration, depending on the overall device requirements. Moreover, in the manufacturing stage shown, a plurality of active regions 202A, 202B may be laterally delineated by isolation trenches 202T formed in the semiconductor layer 202. As shown, the semiconductor layer 202 may be masked by a hard mask layer 206, for instance provided in the form of a first layer 206A, such as a silicon dioxide material, followed by a second layer 206B, such as a silicon nitride material.

As discussed above, the isolation trenches 202T may be formed on the basis of sophisticated lithography and etch techniques while using the mask layer 206 as an efficient etch mask. After any cleaning processes, the device 200 may be processed in a process environment 210 in which respect process atmospheres, such as atmospheres 212, 211, may be established on the basis of a controlled aluminum contamination. For example, in some illustrative embodiments, a high density plasma ambient may be established within the environment 210, which may be accomplished on the basis of well-established deposition process tools, which are appropriately configured so as to provide a high density plasma and the corresponding precursor gases and other process conditions, for instance in terms of pressure, temperature and the like. To this end, a plurality of deposition tools is commercially available. Consequently, when establishing the deposition atmosphere 211, a desired material such as silicon dioxide may be formed so as to fill a certain portion of the trenches 202T, as indicated by 211A. As discussed above, typically the etch atmosphere 212 is then established so as to re-etch a certain amount of the material 211A, preferably at edges of the active regions 202A, 202B, in order to obtain a superior bottom to top fill behavior, even if sophisticated device geometries are considered. It should be appreciated that a width of the trenches 202T may be 100 nm and less in sophisticated process technologies. Thereafter, a further deposition process using the atmosphere 211 may be performed so as to deposit a further portion of the material 211A, followed by a further etch process on the basis of the etch atmosphere 212. Contrary to conventional strategies, however, the process atmospheres 211, 212 may be established by taking into consideration a possible aluminum contamination, for instance by reducing the probability of releasing any aluminum species in the process environment 210.

Figure 2B:
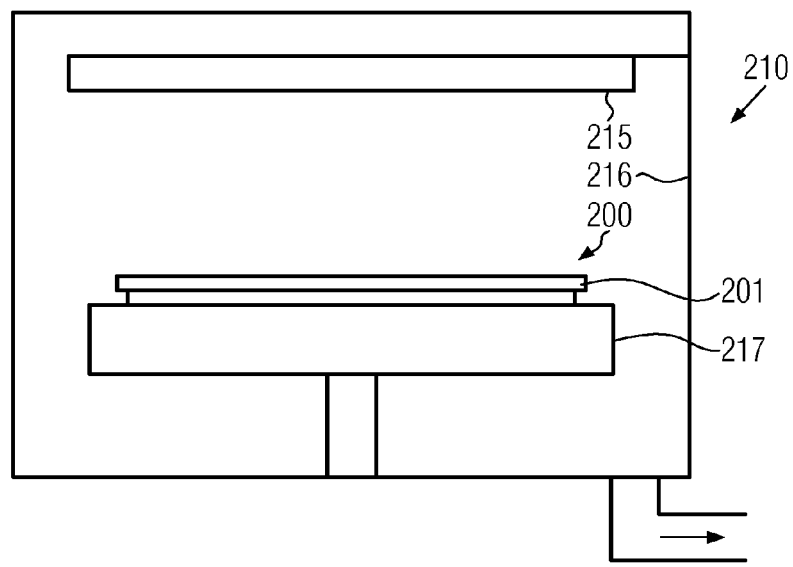
FIG. 2b schematically illustrates a cross-sectional view of a process environment in the form of a deposition chamber in which at least some hardware components are provided as non-aluminum components, according to illustrative embodiments.

FIG. 2b schematically illustrates the device 200 when processed in the environment 210 provided in the form of a deposition process chamber, which may comprise a plurality of hardware components, such as a plasma or gas manifold 215, chamber walls 216 and a substrate stage 217. It should be appreciated that any other hardware components, which are typically provided in a deposition process chamber, are not shown in order to not unduly obscure the principles of the present disclosure. Any such additional hardware components are well established in the art. Consequently, upon processing the device 200, the substrate 201 may be positioned on the substrate stage 217 and the appropriate process atmospheres, such as the process atmospheres 211, 212 (FIG. 2a), may be established. In some illustrative embodiments, the controlling of the aluminum contamination may be accomplished by providing at least some of the hardware components 215, 216 and 217 in the form of non-aluminum components, thereby significantly reducing the probability of releasing any aluminum species during the processing of the device 200. It should be appreciated that a "non-aluminum" component is to be understood as any hardware component which comprises, at least at a surface thereof, a material having an aluminum content of one volume percent or less. For example, hardware components made of steel, plastics and the like may typically be considered as non-aluminum components, since such components may be formed without intentionally incorporating aluminum species. It should be appreciated, however, that that any minute amounts of aluminum may still be present in any such components or materials due to any imperfections of the manufacturing process and due to aluminum contamination upon assembling any such components or operating the same. It should be noted, however, that even the presence of minute amounts of aluminum, or at least at any exposed surface areas thereof, in the process environment 210 may nevertheless result in a significantly reduced aluminum contamination compared to conventional deposition tools, in which moderately large surface areas based on aluminum material are present. For example, by replacing the substrate stage of a conventional process tool and using a non-aluminum substrate stage 217, the probability of sputtering off any aluminum species during, in particular, the etch phase 212 (FIG. 2a) may significantly reduce the aluminum contamination of the corresponding process atmospheres and may thus also reduce the incorporation of an aluminum species in the material 211A (FIG. 2a).

Figure 2C:
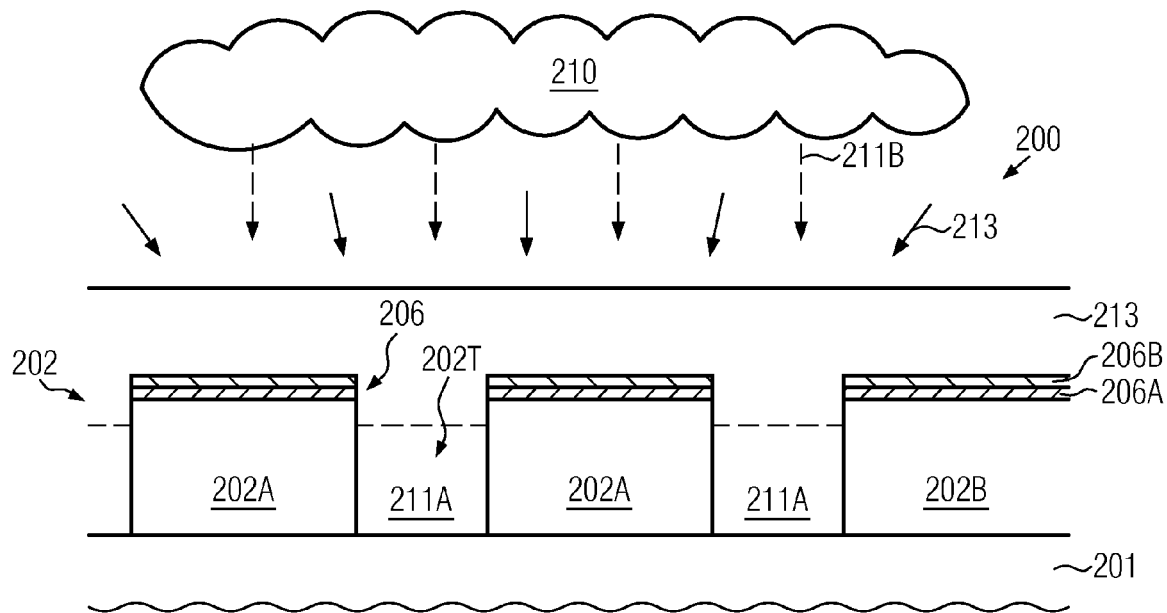
FIG. 2c schematically illustrates the semiconductor device according to further illustrative embodiments in which the process environment with controlled aluminum contamination may be established on the basis of different materials and/or deposition strategies in order to reduce the incorporation of aluminum species into the trench isolation regions, according to further illustrative embodiments.

FIG. 2c schematically illustrates the device 200 according to further illustrative embodiments in which the isolation trenches 202T may be filled in the process environment 210 in which the control and thus the reduction of aluminum contamination may be accomplished by using different materials and/or deposition techniques. For example, in some illustrative embodiments, a deposition atmosphere 211B may be established without high energetic ions in order to reduce the probability of releasing any aluminum atoms from surface areas of the device 200 or any other hardware components that may be present in the environment 210. For example, at least a portion of the material 211A may be provided in the absence of a high density plasma, for instance by using spin-on techniques in combination with appropriate anneal processes for removing any soluble components of the material 211A, which may impart low viscosity to the material 211A upon applying the material on the device 200. For example, a plurality of dielectric materials, such as silicon dioxide and the like, may be formed on the basis of spin-on techniques in combination with anneal processes, which may also allow an efficient filling of critical trenches, such as the isolation trenches 202T. If required, a further deposition atmosphere 213 may be established, for instance on the basis of precursor gases, possibly in combination with a plasma, wherein, however, a significantly reduced ion energy may be applied in order to form a further material layer 213, if required.

Generally, the term "in the absence of high density plasma" is to be understood as any process atmosphere in which the density of ionized particles is not greater than one order of magnitude of the density of ionized particles in the standard clean room ambient outside of any process chambers.

Within the process environment 210, the trenches 202T may then be completely filled and any excess material may then be removed, for instance in a further process environment, by applying sophisticated planarization techniques, for instance using chemical mechanical polishing (CMP) and the like. Prior to or after the removal of any excess material, an anneal process may be applied so as to thermally stabilize and densify the previously formed dielectric material. During this process, the mask layer 206 may be used for superior process control. It should be appreciated that, in other illustrative embodiments, other dielectric materials may be deposited so as to substantially completely fill the trenches 202T, if any such dielectric materials are compatible with the further processing and with the requirements of the device 200. The control of the aluminum contamination may be accomplished in any such cases by corresponding strategies as described above, while in other cases the required control of the aluminum contamination may be implemented by depositing the dielectric material without requiring a high density plasma atmosphere, if any such materials may enable a deposition in a reliable and void-free manner without a high density plasma.

Figure 2D:
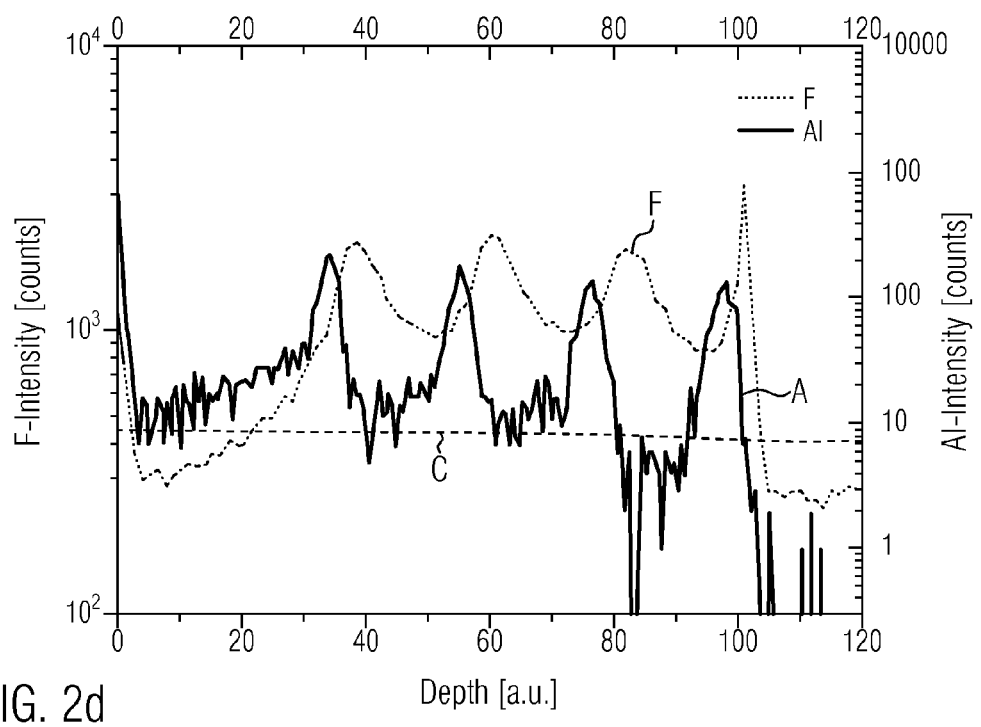
FIG. 2d schematically illustrates a graph with a schematic substantially uniform aluminum contamination in trench isolation regions compared to the situation as illustrated in FIG. 1c when controlling the process atmosphere for forming shallow trench isolations, according to illustrative embodiments.

FIG. 2d schematically illustrates a typical distribution of aluminum in the dielectric material 211A (FIGS. 2a, 2c) when controlling the aluminum contamination, for instance as described above. The horizontal and vertical axes are illustrated in the same manner as already described above with reference to FIG. 1c, while additionally curve C illustrates, in a very schematic manner, a substantially uniform and significantly reduced aluminum intensity in dielectric material of the isolation trenches compared to the pronounced aluminum peaks of curve A, even if a deposition/etch process sequence may be applied. It should be appreciated that curve C illustrates a typical behavior of the aluminum concentration along the depth of the corresponding dielectric material, while, however, also other depth profiles may be created wherein, however, at least a reduction of approximately 50 percent with respect to the maximum peak values of curve A may be obtained for otherwise the same process conditions on the basis of the control of the aluminum contamination described above.

Figure 2E:
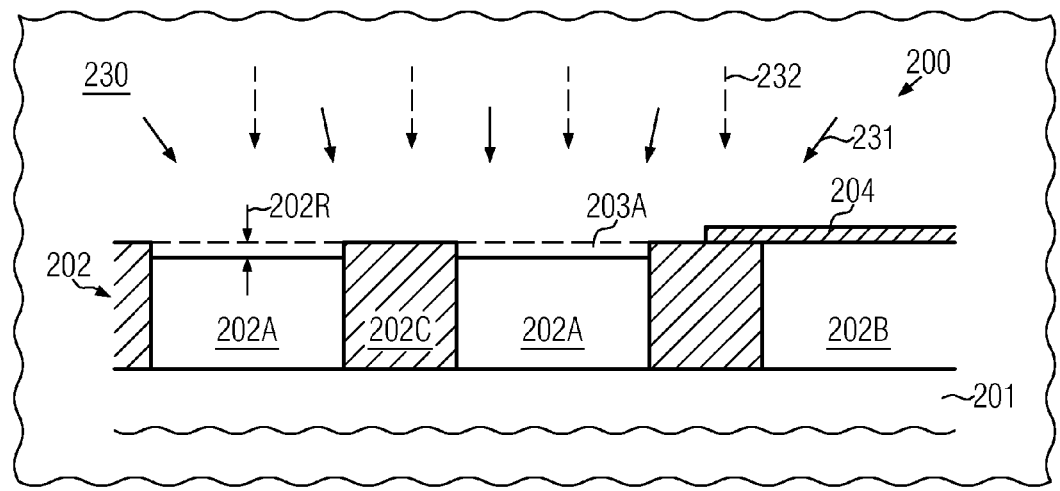
FIG. 2e schematically illustrates a cross-sectional view of the device when processed in a process environment for forming the recess and a semiconductor alloy in an in situ process, according to illustrative embodiments.

FIG. 2e schematically illustrates the device 200 in a further advanced manufacturing stage. As shown, trench isolation regions 202C comprising the dielectric material 211A (FIG. 2c) of improved aluminum contamination are provided so as to laterally delineate the active regions 202A, 202B. Furthermore, a mask layer 204, such as a silicon dioxide material, a silicon nitride material and the like, may be provided so as to cover the active region 202B. To this end, similar process strategies and materials may be applied, as already discussed above with reference to the semiconductor device 100. Moreover, in the manufacturing stage shown, a process environment 230 may be used for the processing of the device 200 in order to perform an in situ process including process steps 231 so as to form a recess 202R in the exposed active regions 202A in a highly controllable manner, followed by the deposition of a semiconductor alloy 203A during a selective epitaxial growth process 232. The processes 231, 232 may be performed on the basis of process techniques as are also described above with reference to the semiconductor device 100. Contrary to conventional strategies, however, the presence of any aluminum species within the environment 230 and in particular within the device 200, may be significantly reduced, thereby also reducing the probability of creating etch irregularities such as undue removal of material of the active regions 202A during the etch process 231. Consequently, the electronic characteristics of the resulting active regions 202A including the semiconductor alloy 203A may be adjusted with superior uniformity since the layer thickness, material composition and the like may be controlled with superior uniformity due to the uniform recessing of the active regions 202A. Furthermore, any non-predictable removal of material in the active regions 202A may be significantly reduced due to a control of the aluminum contamination, as discussed above. Hence, the degree of recessing 202R may be appropriately adjusted with respect to the desired final surface topography, for instance in view of obtaining substantially similar height levels for the active regions 202A including the material 203A and the active region 202B after the removal of the hard mask material 204.

Figure 2F:
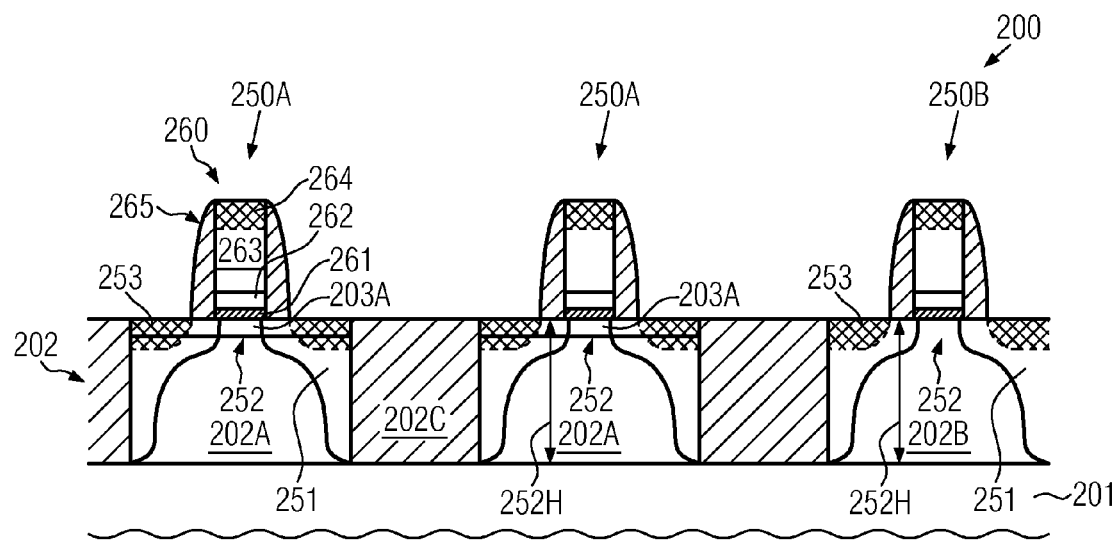
FIG. 2f schematically illustrates a cross-sectional view of the semiconductor device in a further advanced manufacturing stage, according to still further illustrative embodiments.

FIG. 2f schematically illustrates a cross-sectional view of the device 200 in a further advanced manufacturing stage. As shown, transistors 250A may be formed in and above the active regions 202A which may comprise, at least in a portion thereof, the semiconductor alloy 203A, thereby imparting the desired electronic characteristics to channel regions 252 of the transistors 250A. On the other hand, the channel region 252 of a transistor 250B may be provided without requiring an additional semiconductor alloy. Furthermore, in this manufacturing stage, drain and source regions 251 may be provided in the active regions 202A, 202B, possibly in combination with appropriate contact regions 253, for instance provided in the form of a metal silicide and the like. As discussed above, in some illustrative embodiments, the height level 252H of the channel regions 252 may be very similar in the transistors 250A, 250B due to the appropriate adaptation of the recessing 202R (FIG. 2e) and the thickness of the material 203A with respect to the active region 202B. For example, a deviation of the height levels 252H of the transistors 250A, 250B may be 10 nm or less.

Furthermore, in the manufacturing stage shown, the transistors 250A, 250B may comprise gate electrode structures 260 which may basically have the same configuration and may comprise a gate dielectric material 261 followed by an electrode material 262, possibly in combination with a further electrode material 263. Furthermore, in some illustrative embodiments, metal-containing material 264, for instance in the form of a metal silicide, may be provided and the materials 261, 262, 263 and 264 may be laterally confined by a spacer structure 265. As discussed above, in some illustrative embodiments, the gate dielectric material 261 may be provided in the form of a high-k dielectric material having a dielectric constant of 10.0 and higher. For example, the layer 261 may comprise a metal such as hafnium, zirconium and the like, in combination with silicon, oxygen, nitrogen and the like, for instance in the form of separated dielectric layers or in the form of a substantially uniform material composition, depending on the overall process strategy used for forming the dielectric material 261. In this case, the electrode material 262 may be provided in the form of a metal-containing electrode material, such as a material comprising titanium, tantalum and the like, in order to provide superior conductivity and also adjust a work function of the gate electrode structures 260. It should be appreciated that basically the materials 261, 262 may have a different composition with respect to interface states, metal species incorporated therein, as required for adjusting an appropriate work function for different types of transistors. Furthermore, the material 263 may be provided in the form of a semiconductor material, such as polysilicon and the like.

The semiconductor device 200 as shown in FIG. 2f may be formed on the basis of any appropriate process strategy. That is, after forming the semiconductor alloy 203A selectively in the active regions 202A, appropriate materials for the gate electrode structures 260 may be provided and may be subsequently patterned on the basis of sophisticated lithography and etch strategies. Consequently, sophisticated high-k metal gate electrode structures may be formed in an early manufacturing stage wherein the overall electronic characteristics and in particular the threshold voltage of the transistors 250A, 250B may be adjusted on the basis of the materials 261, 262 and in combination with the material 203A. Thereafter, the drain and source regions 251 may be formed, for instance by implantation techniques and the like, followed by one or more anneal processes in order to adjust the final lateral and vertical dopant profile. It should be appreciated that additional performance enhancing mechanisms may be implemented, for instance in the form of a semiconductor alloy that may be incorporated into the active regions of at least one type of transistor, for instance in the form of a silicon/germanium alloy and the like, which may be accomplished by forming cavities (not shown) and refilling the cavities with an appropriate semiconductor material in the presence of the gate electrode structures 260 having an appropriate configuration of the spacer structure 265 so as to appropriately determine a lateral offset of the corresponding strain-inducing semiconductor material.

It should be appreciated that, in other illustrative embodiments, the gate electrode structures 260 may represent non-completed structures, wherein one or more of the materials of the gate electrode structures 260 may be replaced with sophisticated materials, such as highly conductive electrode metals, a high-k dielectric material and the like, in a further advanced manufacturing stage.

As a result, the present disclosure provides manufacturing techniques and semiconductor devices in which a highly efficient in situ process may be applied for recessing specific active regions and forming a semiconductor material thereon on the basis of selective growth techniques, wherein the presence of an aluminum species, in particular during the in situ etch process, may be reduced by controlling aluminum contamination of process atmospheres and the semiconductor products during the previous processing, in particular during the formation of trench isolation regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A semiconductor device, comprising:
a trench isolation structure formed in a semiconductor layer, said trench isolation structure having a substantially uniform, non-zero aluminum concentration profile along a depth of said trench isolation structure;
an active region formed in said semiconductor layer and laterally delineated by said trench isolation structure so as to define a first length and a width of said active region;
a threshold voltage adjusting semiconductor alloy formed on said active region and extending along the width of said active region so as to substantially not overlap with said trench isolation structure; and a gate electrode structure formed on said threshold voltage adjusting semiconductor alloy, said gate electrode structure comprising a high-k dielectric material and a metal-containing electrode material formed above said high-k dielectric material.

2. The semiconductor device of claim 1, further comprising a second active region comprising a silicon channel region and a second gate electrode structure formed on said silicon channel region, wherein a surface of said silicon channel region and a surface of said threshold adjusting semiconductor alloy extend to substantially the same height level.

\* \* \* \* \*